United States Patent
Chang et al.

(10) Patent No.: US 7,799,596 B2
(45) Date of Patent: Sep. 21, 2010

(54) PHASE CHANGE MEMORY DEVICE AND METHOD FOR MANUFACTURING THE SAME

(75) Inventors: Heon Yong Chang, Kyoungki-do (KR); Suk Kyoung Hong, Kyoungki-do (KR); Hae Chan Park, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/359,431

(22) Filed: Jan. 26, 2009

(65) Prior Publication Data

US 2009/0137080 A1    May 28, 2009

Related U.S. Application Data

(62) Division of application No. 11/445,523, filed on Jun. 2, 2006, now abandoned.

(30) Foreign Application Priority Data

Jun. 10, 2005  (KR)  ................ 10-2005-0049784

(51) Int. Cl.
*H01L 21/00*  (2006.01)
(52) U.S. Cl. ............................ 438/95; 257/2; 257/296; 257/E29.101

(58) Field of Classification Search ............ 257/2, 257/E29.101, 296; 438/95
See application file for complete search history.

(56) References Cited

U.S. PATENT DOCUMENTS

| 2004/0027844 | A1* | 2/2004 | Nejad et al. ............ 365/1 |
| 2004/0053461 | A1* | 3/2004 | Moore et al. .......... 438/225 |
| 2005/0101084 | A1* | 5/2005 | Gilton ................... 438/232 |

FOREIGN PATENT DOCUMENTS

| JP | 2006-156886 A | 6/2006 |
| KR | 1020060001091 A | 1/2006 |
| KR | 1020060092398 A | 8/2006 |

* cited by examiner

*Primary Examiner*—Tan N Tran
(74) *Attorney, Agent, or Firm*—Ladas & Parry LLP

(57) ABSTRACT

A phase change memory device reduces the current necessary to cause a phase change of a phase change layer. The phase change memory device includes a first oxide layer formed on a semiconductor substrate; a lower electrode formed inside the first oxide layer; a second oxide layer formed on the first oxide layer including the lower electrode, the second oxide having a hole for exposing a part of the lower electrode; a phase change layer formed on a surface of the hole with a uniform thickness so as to make contact with the lower electrode; and an upper electrode formed in the hole and on a part of the second oxide layer, the part being adjacent to the hole.

2 Claims, 5 Drawing Sheets

PHASE CHANGE MEMORY DEVICE AND METHOD FOR MANUFACTURING THE SAME

FIELD OF THE INVENTION

The present invention relates to a phase change memory device and a method for manufacturing the same. More particularly, the present invention relates to a phase change memory device capable of efficiently reducing the current necessary to change the phase of a phase change layer and a method for manufacturing the same.

DESCRIPTION OF THE PRIOR ART

As generally known in the art, memory devices are classified into volatile memory devices, i.e., random access memory or RAM devices, which lose information when power to the device is interrupted, and non-volatile ROM (read only memory) devices, which retain inputted information even when the power is interrupted. The volatile RMA devices further include DRAM and SRAM devices. Non-volatile ROM devices include flash memory devices, such as EEPROM (electrically erasable and programmable ROM) devices.

Although DRAM devices are excellent memory devices as widely known in the art, they rely on electrical capacitance to store data and therefore require a relatively large charge storage capacity. To this end, the surface area of capacitor electrodes must be increased, making it difficult to highly integrate the devices.

Flash memory devices have two gates stacked on each other and require an operating voltage higher than the power voltage. This means that a separate booster circuit is necessary to establish a voltage for writing and erasing operations. This makes it difficult to highly integrate the devices.

A phase change memory device has been proposed as a device to provide non-volatile memory. Phase change memory devices have a simple structure and can be highly integrated while retaining the characteristics of non-volatile memory devices.

A phase change memory device reads information stored on cells using the difference in resistance between crystalline and amorphous conditions, when a phase change layer interposed between upper and lower electrodes undergoes phase change from crystalline to amorphous conditions as current flows between the electrodes.

More specifically, a phase change memory device uses a chalcogenide layer as the phase change layer. The chalcogenide layer is a compound layer including germanium (Ge), stibium (Sb), and tellurium (Te) and undergoes phase change between amorphous and crystalline conditions by means of application of current (i.e. Joule heat). In the amorphous condition, the resistance of the phase change layer is higher than that in the crystalline condition. Therefore, the device senses the current flowing through the phase change layer in writing and reading modes and determines whether the information stored on the phase change memory cell is logic '1' or logic '0.'

FIG. 1 is a sectional view showing a conventional phase change memory device.

As shown, gates 4 are formed in an active region of a semiconductor substrate 1, which is delimited by a device isolation layer, and a junction region (not shown) is formed inside a surface of the substrate on both sides of the gates 4.

An insulation interlayer 5 is formed on the front surface of the substrate 1 so as to cover the gates 4. First tungsten plugs 6a are formed on parts of the insulation interlayer 5 corresponding to regions in which phase change cells are to be formed. Second tungsten plugs 6b are formed on parts of the insulation interlayer 5 corresponding to regions in which ground voltage Vss is to be applied.

A first oxide layer 7 is formed on the insulation interlayer 5 including the first and second tungsten plugs 6a an 6b. Although not shown in detail, dot-type metal pads 8 are formed in the region, in which phase change cells are to be formed, so as to make contact with the first tungsten plugs 6a. Bar-type ground lines 9 are formed in the regions, to which ground voltage is to be applied, so as to make contact with the second tungsten plugs 6b.

A second oxide layer 10 is formed on the first oxide layer 7 including the metal pads 8 and the ground lines 9. Plug-type lower electrodes 11 are formed in regions of the second oxide layer 10, in which phase change cells are to be formed, so as to make contact with the metal pads 8.

Phase change layers 12 and upper electrodes 13 are laminated on the second oxide layer 10 in a pattern type so as to make contact with the lower electrodes 11. Together with the plug-type lower electrodes 11, the phase change layers 12 and the upper electrodes 13 constitute phase change cells, respectively.

A third oxide layer 14 is formed on the second oxide 10 so as to cover the phase change cells. Metal wirings 15 are formed on the third oxide layer 14 so as to make contact with the upper electrodes 13.

In a phase change memory device, a relatively large amount of current (e.g. at least 1 mA) is necessary to cause a phase change of the phase change layers. Therefore, the contact area between the phase change layers and the electrodes must be reduced, in order to lower the current necessary for phase change of the phase change layers.

The conventional phase change memory device shown in FIG. 1 undergoes phase change at the interface between the lower electrodes and the phase change layers in a semispherical type. Particularly, in the case of a stacked phase change memory device having lower electrodes, phase change layers, and upper electrodes stacked thereon, most current flows vertically from the upper electrodes to the plug-type lower electrodes. For this reason, the phase change layers undergo phase change in a semispherical type.

When the phase change layers undergo phase change in a semispherical type, a smaller amount of current flows through the edge of the top of each plug-type lower electrode than the center thereof. This means that the phase change rate is slower at the edge. As a result, a larger amount of current is necessary for phase change, in order to compensate for the slow phase change rate.

In summary, it is difficult to reduce the current necessary to accomplish a phase change of phase change layers in the case of conventional phase change memory devices. This means that it is not easy to guarantee stable electric characteristics of the phase change memory devices.

SUMMARY OF THE INVENTION

An object of the present invention is to provide a phase change memory device capable of efficiently reducing the current necessary for phase change of a phase change layer and a method for manufacturing the same.

In order to accomplish this object, there is provided a phase change memory device including a first oxide layer formed on a semiconductor substrate; a lower electrode formed inside the first oxide layer; a second oxide layer formed on the first oxide layer including the lower electrode, the second oxide having a hole for exposing a part of the lower electrode; a phase change layer formed on a surface of the hole with a uniform thickness so as to make contact with the lower electrode; and an upper electrode formed in the hole and on a part of the second oxide layer, the part being adjacent to the hole.

The phase change layer may be additionally formed between the upper electrode and the second oxide layer.

In accordance with another aspect of the present invention, there is provided a method for manufacturing a phase change memory device including the steps of forming a first oxide layer on a semiconductor substrate; forming a lower electrode inside the first oxide layer in a damascene process; forming a second oxide layer on the first oxide layer so as to cover the lower electrode; etching the second oxide layer to form a hole for exposing a part of the lower electrode; forming a phase change layer on a surface of the hole and on the second oxide layer with a uniform thickness, the surface of the hole including the exposed part of the lower electrode; applying a photosensitive layer on the phase change layer so as to fill the hole; removing the phase change layer and the photosensitive layer on the second oxide layer by chemical mechanical polishing; removing the photosensitive layer remaining in the hole; depositing a conductive layer on the remaining phase change layer and the second oxide layer so as to fill the hole; and etching the conductive layer to form an upper electrode.

In accordance with still another aspect of the present invention, there is provided a method for manufacturing a phase change memory device including the steps of forming a first oxide layer on a semiconductor substrate; forming a lower electrode inside the first oxide layer in a damascene process; forming a second oxide layer on the first oxide layer so as to cover the lower electrode; etching the second oxide layer to form a hole for exposing a part of the lower electrode; forming a phase change layer on a surface of the hole and on the second oxide layer with a uniform thickness, the surface of the hole including the exposed part of the lower electrode; depositing an upper electrode conductive layer on the phase change layer so as to fill the hole; and etching the conductive layer and the phase change layer to form an upper electrode.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION

Figure 1:
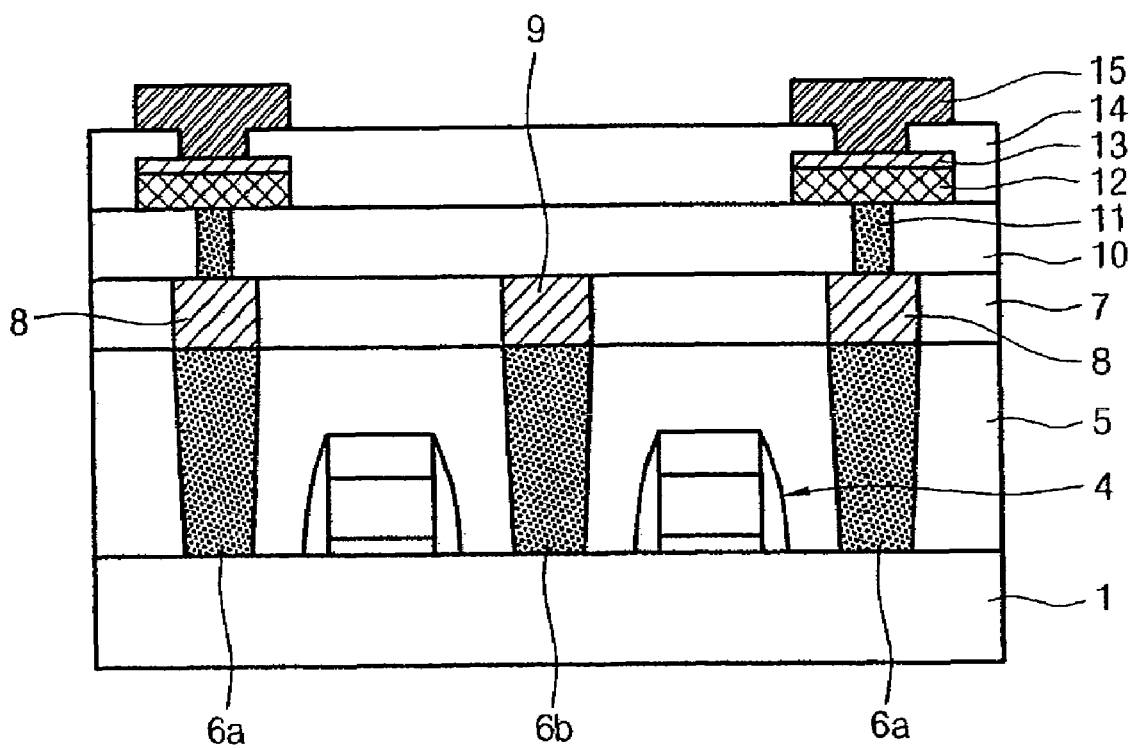
FIG. 1 is a sectional view showing a conventional phase change memory device.

Hereinafter, a preferred embodiment of the present invention will be described with reference to the accompanying drawings. In the following description and drawings, the same reference numerals are used to designate the same or similar components, and so repetition of the description on the same or similar components will be omitted.

Referring to the figures, a lower electrode is stably formed in a damascene process; a phase change layer is formed on the surface of a hole with a uniform thickness in an ALD (atomic layer deposition) or CVD (chemical vapor deposition) process; and the hole is filled to form an upper electrode.

Although the contact area between the upper electrode and the phase change layer is large, electrical current flowing from the upper electrode to the lower electrode via the phase change layer is concentrated on the lower portion of the hole, which has the smallest resistance. This means that, in the case of the phase change memory device according to the present invention, most phase change of the phase change layer occurs on a portion formed on the bottom surface of the hole. As a result, the rate of change of the phase change layer is faster than that of conventional phase change memory devices, and the amount of current necessary for phase change is reduced accordingly.

In addition, according to the present invention, the lower electrode is not formed in a plug type. This means it is unnecessary to form a plug-type lower electrode with a size less than 100 nm so as to reduce the contact area between the electrode and the phase change layer. In addition, any difficulty related to a process for forming the lower electrode is avoided.

A method for manufacturing a phase change memory device according to an embodiment of the present invention will now be described in more detail with reference to FIGS. 2A to 2E, which are sectional views showing a series of processes of the method.

Figure 2A:
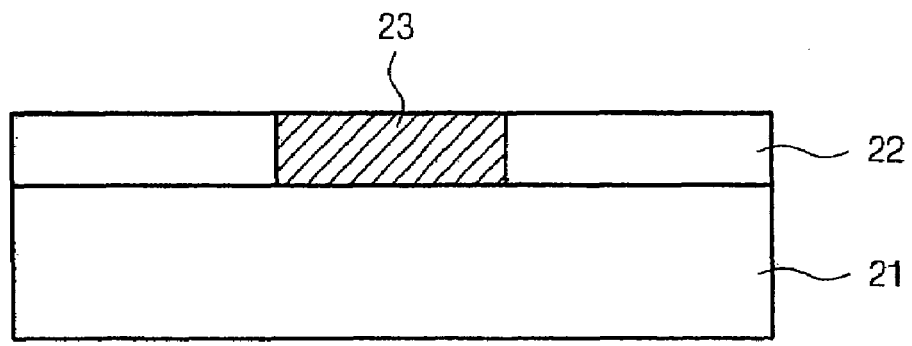
FIGS. 2A to 2E are sectional views showing a series of processes of a method for manufacturing a phase change memory device according to an embodiment of the present invention.

Referring to FIG. 2A, a semiconductor substrate 21 is provided which includes a primer layer (not shown) including a gate, a tungsten plug, and an insulation interlayer. A first oxide layer 22 is formed on the semiconductor substrate 21. A lower electrode 23 is formed inside the first oxide layer 22 in a conventional damascene process.

Figure 2B:
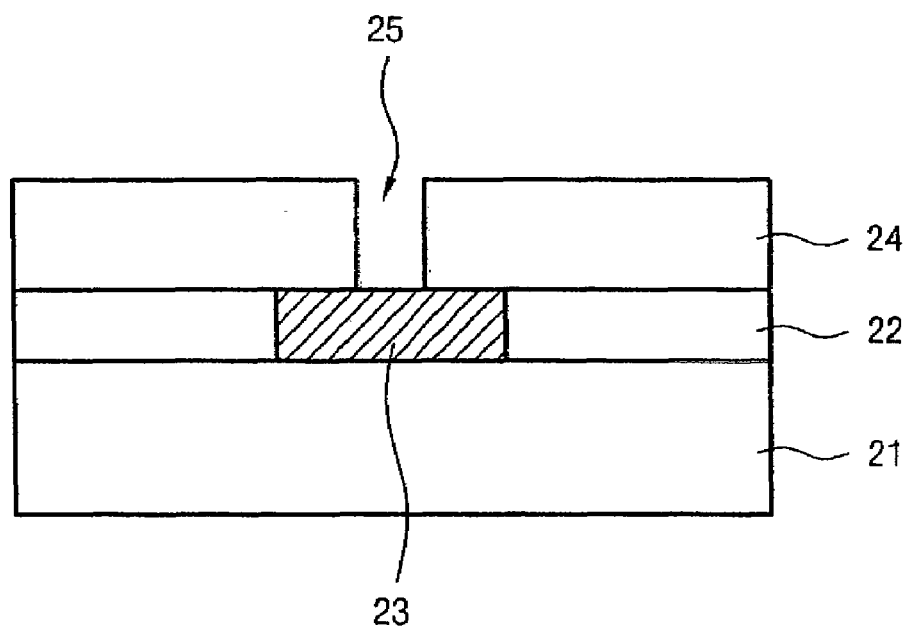

Referring to FIG. 2B, a second oxide layer 24 is formed on the first oxide layer 22 including the lower electrode 23. The second oxide layer 24 is etched to form a hole 25, which exposes the lower electrode 23.

The size of the hole 25 is equal to or larger than 100 nm, in contrast to that of conventional phase change memory devices having plug-type lower electrodes. Therefore, the present invention can solve the problem related to formation of the hole 25, particularly, the uniformity problem occurring when a lower electrode contact is formed.

Figure 2C:
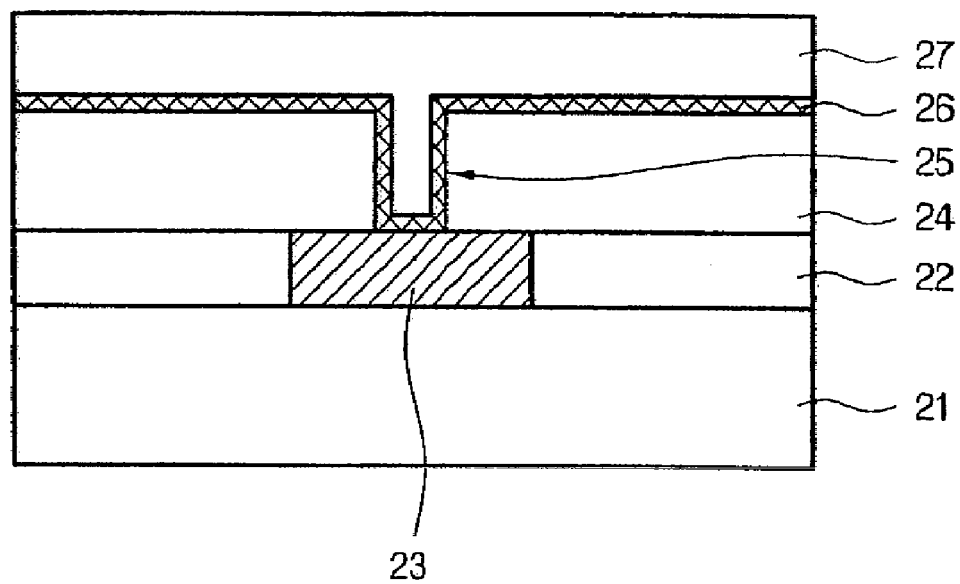

Referring to FIG. 2C, a phase change layer 26 is formed on the second oxide layer 24, including the hole 25, with a uniform thickness. A photosensitive layer 27 is applied to the phase change layer 26 so as to fill the hole 25.

Figure 2D:
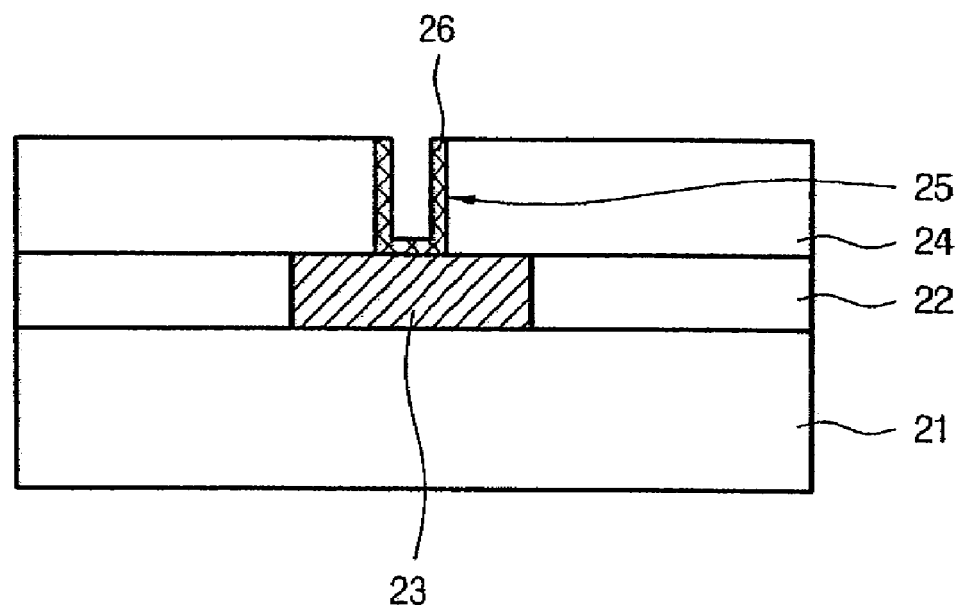

Referring to FIG. 2D, the photosensitive layer and the phase change layer 26 are subjected to CMP (chemical mechanical polishing), in order to remove the part of the phase change layer formed on the second oxide layer 24 and leave the phase change layer 26 only on the surface of the hole 25. Then, the remaining photosensitive layer is removed.

Figure 2E:
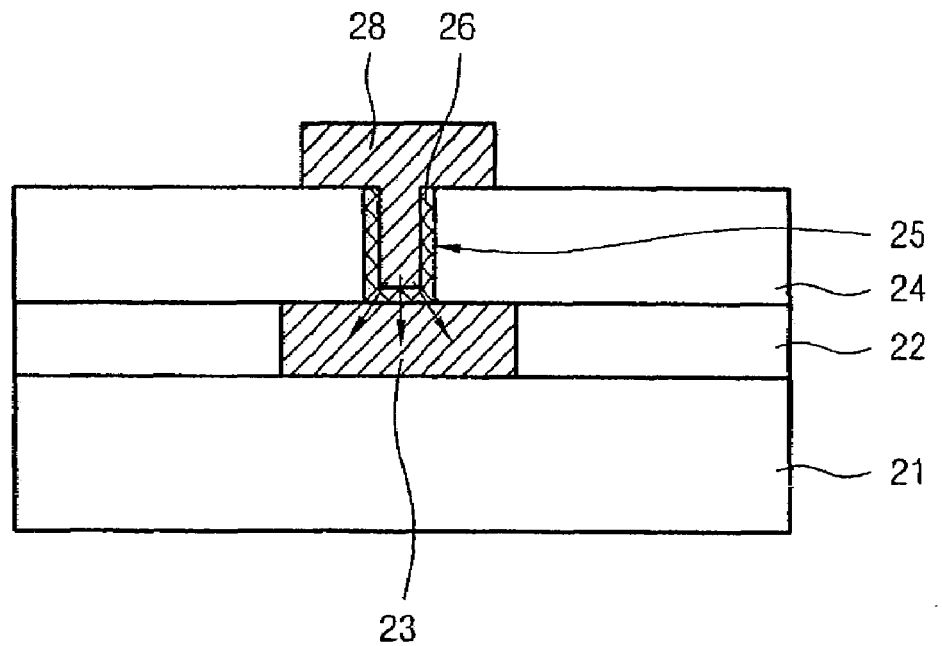

Referring to FIG. 2E, an upper electrode conductive layer is deposited on the remaining phase change layer 26 and the second oxide layer 24 so as to fill the hole 25. The conductive layer is etched to form an upper electrode 28. This provides a phase change cell, which has a lamination structure including the lower electrode 23, the phase change layer 26, and the upper electrode 28.

Although not shown in the drawings, a series of conventional processes are performed subsequently to complete a phase change memory device according to the present invention.

As mentioned above, although the contact area between the upper electrode and the phase change layer is large in the phase change cell of the phase change memory device according to the present invention, the current flowing from the upper electrode to the lower electrode via the phase change layer is concentrated on the lower portion of the hole. As result, the phase change rate of the phase change layer increases, and the amount of writing current necessary for phase change is reduced substantially.

Although the phase change layer is left only on the surface of the hole by performing photosensitive layer application and a CMP process after forming the phase change layer in the present embodiment, the upper electrode conductive layer may be deposited after formation of the phase change layer without performing the photosensitive layer application and the CMP process.

A method for manufacturing a phase change memory device according to another embodiment of the present invention will now be described with reference to FIGS. 3A and 3B, which are sectional views showing respective processes of the method. In the following description, the same components as in the previous embodiment are given the same reference numerals, and repeated description thereof will be omitted.

Figure 3A:
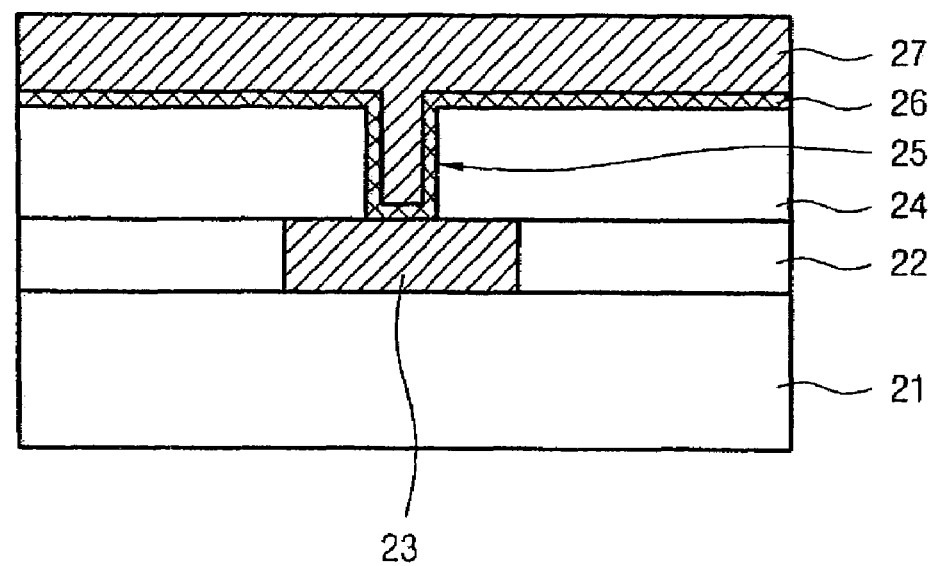
FIGS. 3A and 3B are sectional views showing respective processes of a method for manufacturing a phase change memory device according to another embodiment of the present invention.

After forming a hole 25 for exposing the lower electrode 23, a phase change layer 26 is formed on the second oxide layer 24, including the hole 25, as shown in FIG. 3A. An upper electrode conductive layer is deposited on the phase change layer 26 so as to fill the hole 25.

Figure 3B:
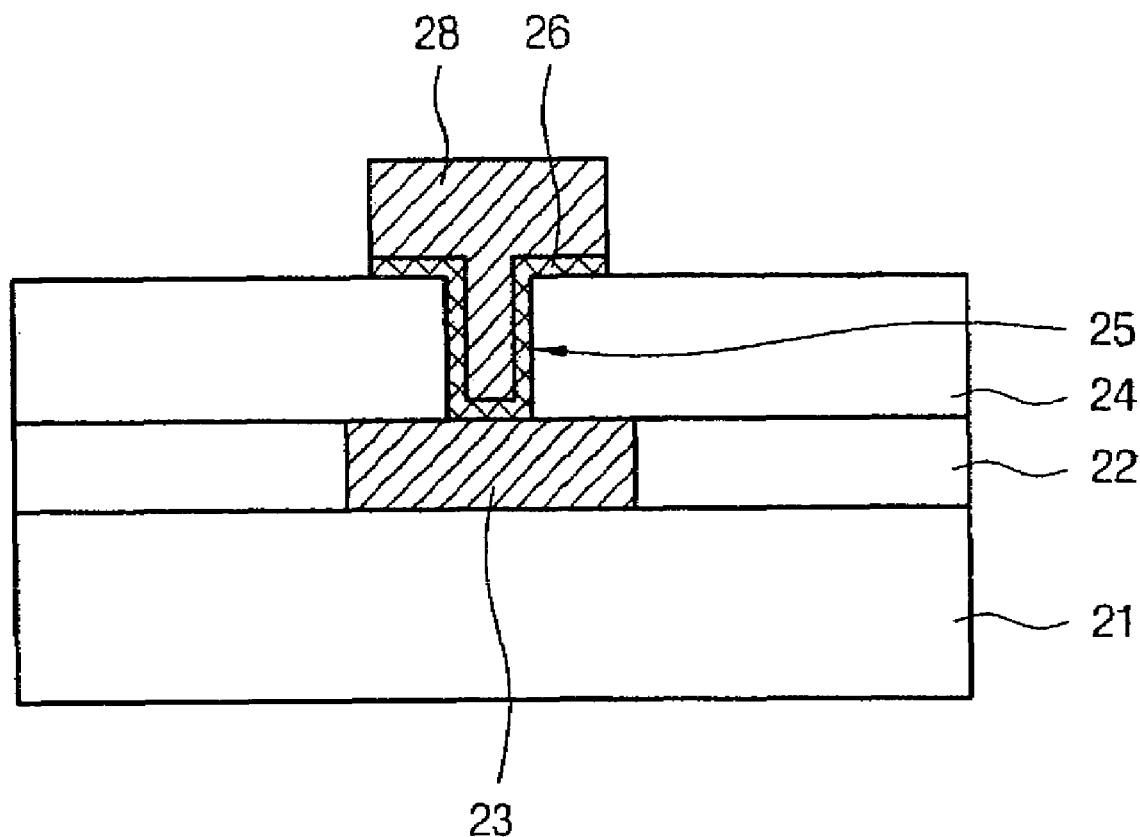

As shown in FIG. 3B, the conductive layer is etched to form an upper electrode 28, and the phase change layer 26 is etched subsequently to complete a phase change cell.

Although not shown in the drawings, a series of conventional processes are performed subsequently to complete a phase change memory device, as in the previous embodiment.

The present invention can simplify the processes and reduce the cost by omitting the photosensitive layer application and the CMP process while obtaining the same advantages as in the previous embodiment.

As mentioned above, the present invention is advantageous in that, since the phase change layer is formed on the surface of the hole with a uniform thickness and the upper electrode is formed by filling the hole, the resistance in the path, along which the current flows, decreases. This efficiently reduces the current necessary for phase change of the phase change layer and improves the speed of the phase change memory device.

The lower electrode is not formed in a small size, due to consideration of the contact area with the phase change layer, but in a large size. This stabilizes the shape and increases the yield and reliability of the phase change memory device.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for manufacturing a phase change memory device comprising the steps of:
    forming a first oxide layer on a semiconductor substrate;
    forming a lower electrode inside the first oxide layer in a damascene process;
    forming a second oxide layer on the first oxide layer so as to cover the lower electrode;
    etching the second oxide layer to form a hole for exposing a part of the lower electrode;
    forming a phase change layer on a surface of the hole and on the second oxide layer with a uniform thickness, the surface of the hole including the exposed part of the lower electrode;
    applying a photosensitive layer on the phase change layer so as to fill the hole;
    removing the phase change layer and the photosensitive layer on the second oxide layer by chemical mechanical polishing;
    removing the photosensitive layer remaining in the hole;
    depositing a conductive layer on the remaining phase change layer and the second oxide layer so as to fill the hole; and
    etching the conductive layer to form an upper electrode.

2. The method for manufacturing a phase change memory device as claimed in claim 1, wherein the phase change layer is formed with a substantially uniform thickness in an atomic layer deposition or chemical vapor deposition process.

* * * * *